United States Patent [19]
Nishino

[11] Patent Number: 5,331,201
[45] Date of Patent: Jul. 19, 1994

[54] SEMICONDUCTOR DEVICE HAVING INNER LEAD ARRANGEMENT WITH ENHANCED STABILITY

[75] Inventor: Tomoki Nishino, Kanagawa, Japan

[73] Assignee: Sony Corporation, Tokyo, Japan

[21] Appl. No.: 995,060

[22] Filed: Dec. 22, 1992

[30] Foreign Application Priority Data

Dec. 24, 1991 [JP] Japan .................................. 3-339210

[51] Int. Cl.[5] ..................... H01L 23/48; H01L 29/44; H01L 29/52; H01L 29/60
[52] U.S. Cl. ..................................... 257/666; 257/691
[58] Field of Search ................ 257/666, 691, 676, 668

[56] References Cited

U.S. PATENT DOCUMENTS

| | | | |
|---|---|---|---|
| 5,115,298 | 5/1952 | Loh | 257/691 |
| 5,164,815 | 11/1992 | Lim | 257/666 |
| 5,206,536 | 4/1993 | Lim | 257/668 |

FOREIGN PATENT DOCUMENTS 0405871 2/1991. European Pat. Off. ............ 257/691

*Primary Examiner*—Rolf Hille
*Assistant Examiner*—S. V. Clark
*Attorney, Agent, or Firm*—Hill, Steadman & Simpson

[57] ABSTRACT

A resin-sealed semiconductor device comprising a semiconductor chip having pad electrodes formed on a circuit forming surface in the interior of the main surface and inner leads cemented to the semiconductor chip through an insulator for electric insulation such that ends of the inner leads reach the edge of the circuit forming surface of the semiconductor chip, wherein common conductors, which are connected with at least one of power supplying inner leads and/or grounding inner leads, and at least one of the inner leads are coupled on the semiconductor chip, and wherein the configuration of the common conductors and the inner leads coupled together is virtually L-shaped, T-shaped, -shaped, or cross-shaped.

5 Claims, 4 Drawing Sheets

SEMICONDUCTOR DEVICE HAVING INNER LEAD ARRANGEMENT WITH ENHANCED STABILITY

BACKGROUND OF THE INVENTION

1. Field of the Invention

The present invention relates to a resin-sealed semiconductor device and, more particularly, to a resin-sealed semiconductor device of an LOC (Lead-On-Chip) arrangement suitable for mounting on a semiconductor chip having a large-scale integrated circuit.

2. Description of the Prior Art

In packages of the prior art, in order to have a semiconductor chip constantly increasing in scale mounted in a standardized package size, there are proposed packages of the so-called LOC arrangement for example in Japanese Patent Laid-open No. 61-241959 and Japanese Patent Laid-open No. 2-246125.

The package of the LOC arrangement provides a resin-sealed semiconductor device in which inner leads extended from outer leads are cemented to the circuit forming surface of a semiconductor chip through a film insulator, common conductors engaged With the inner leads are disposed on the film insulator, and pad electrodes formed on a portion of the semiconductor chip uncovered by the film insulator are electrically connected with the inner leads and the common conductors by bonding wires or the like.

In the above described resin-sealed semiconductor device, the inner leads engaged with the common conductors are those of power supply system such as a power supplying inner lead (Vcc) and a grounding inner lead (Vss). The number and positions of the inner leads of power supply system engaged with the common conductors are specified in a standard prescribing the lead terminal names.

Accordingly, when the number of the inner lead of power supply system engaged with the common conductor is one, for example when the package is of an SOJ (Small Out-line J-bend) type, if the number of the outer lead of power supply system located in the center of one side of the package is one, the inner lead formed of the common conductor and the inner lead of power supply system have a T-shaped configuration and, in addition, both ends of the common conductor being the top bar of the letter T are not coupled with any other inner leads. Therefore, a twist of the common conductor around the inner lead of power supply system is liable to occur.

On the other hand, when there are a pair of outer leads of power supply system (Vcc outer lead and Vss outer lead) located in the center of one side of a package of the SOJ type, the configurations of the inner leads formed of the common conductors and the inner leads of power supply system become L-shaped connected only with the outer leads independent of each other. Hence, as a matter of course, twists are equally liable to occur.

Further, when the number of the outer leads of the same power supply system located at one side of an SOJ package is two and they are disposed at both ends of the side, the configuration of the inner lead formed of the common conductor and the inner leads of power supply system becomes $\pi$-shaped. Though a certain improvement in preventing occurrence of a twist is shown in this case over that of the T-shaped or L-shaped configuration, it is impossible to thoroughly eliminate the twist.

When a twist is present at the portion of the inner lead transforming into the common conductor, there is the possibility that the adhesive strength between the insulator and the inner lead or the common conductor becomes ununiform and the top surfaces of the end portion of the inner lead and the common conductor become different in level, and eventually an inclination is produced in the semiconductor chip.

As a consequence of the foregoing, there has been the possibility in executing the wire bonding that stabilized wire bonding becomes unachievable because supersonic energy is not transmitted effectively and a bonding wire crossing over the common conductor comes in touch with it and causes a short because the common conductor is rising. Further, when the semiconductor chip is inclined, there has been the possibility in the injection of sealing resin that great imvalance is produced between the flowing speed of the resin at the upper portion of the chip and that at the lower portion of the chip and, hence, failure in resin forming is produced such as a resin-unfilled portion or a void of resin.

An object of the present invention is to provide a resin-sealed semiconductor device, in which, even if a large number of outer leads of power supply system are used and they are disposed in various positions, stabilized wire bonding and stabilized resin forming can be performed.

SUMMARY OF THE INVENTION

The present invention has been made to overcome the above described difficulties. According to the present invention, there is provided a resin-sealed semiconductor device comprising a semiconductor chip having pad electrodes formed on a circuit forming surface in the interior of the main surface and inner leads cemented to the semiconductor chip through an insulator for electric insulation such that ends of the inner leads reach the edge of the circuit forming surface of the semiconductor chip, wherein common conductors, which are connected with at least one of power supplying inner leads and/or grounding inner leads, and at least one of the inner leads are coupled on the semiconductor chip, and wherein the configuration of the common conductors and the inner leads coupled together is virtually L-shaped, T-shaped, $\pi$-shaped, or cross-shaped.

Accordingly, when the number of the outer lead of power supply system disposed on one side of the package of an SOJ package is one, a T-shaped inner lead formed of a common conductor and an inner lead of power supply system is coupled with other members at its ends in three directions. More specifically, both ends of the common conductor as the top bar of the letter T are coupled with support bars pulled in from both sides, while the inner lead of power supply system is coupled with the common conductor substantially forming right angles with it. Therefore, the T-shaped inner lead of the present invention is made stronger than the T-shaped inner lead in the prior art.

As a consequence of the foregoing, occurrence of the twist, deformation, or the like at the portion of the inner lead transforming into the common conductor can be prevented, the adhesive strength between the insulator and the inner lead or the common conductor becomes uniform, and the top surfaces of the end portion of the inner lead and the common conductor become the same in level. Hence, occurrence of an inclination in the semiconductor chip at the time of cementing can be prevented. Thus, stable wire bonding can be achieved, shorting of the bonding wire can be reduced, and failure in resin forming such as a resin-unfilled portion or a void of resin can be avoided.

Further, when there are a pair of outer leads of power supply system (Vcc outer lead and Vss outer lead) located in the center of one side, each L-shaped inner lead formed of the common conductor and the inner lead of power supply system is integrally coupled at both ends of the letter L with the lead frame by way of the support bar and with the outer lead and, hence, a strong inner lead can be equally obtained. The same is true of the case where there are a plurality of outer leads for the same power supply system, i.e., where the configuration is $\pi$-shaped.

DETAILED DESCRIPTION OF THE PREFERRED EMBODIMENTS

The resin-sealed semiconductor device according to the present invention will be described below in detail with reference to the accompanying drawings.

Figure 1:
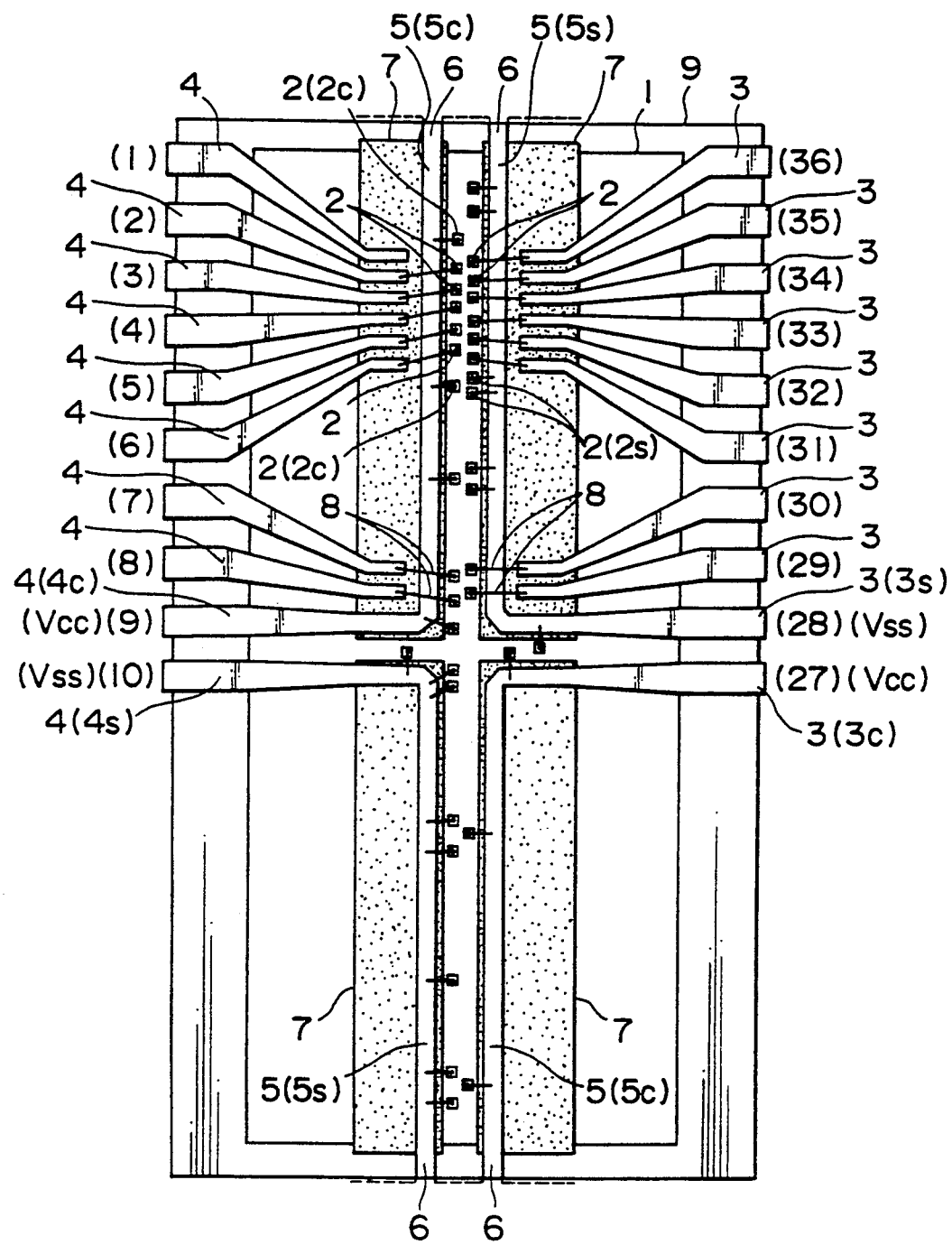
FIG. 1 is a plan view of a resin-sealed semiconductor device of a first embodiment of the present invention with a portion of the seal resin above a portion of leads broken away.
Figure 2:
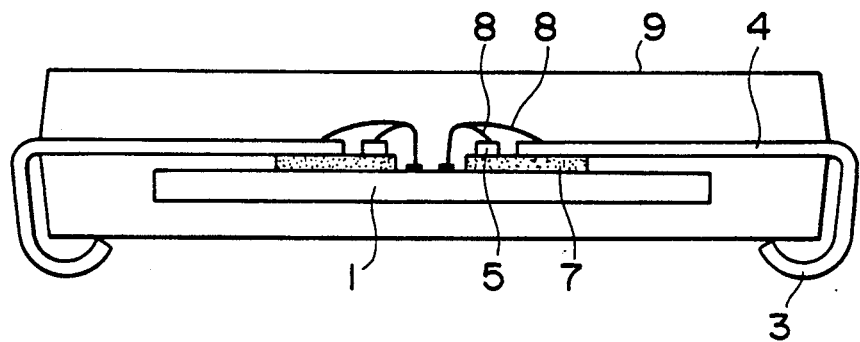
FIG. 2 is a sectional view of a resin-sealed semiconductor device of the present invention.

FIG. 1 and FIG. 2 are views showing a first embodiment of the resin-sealed semiconductor device according to the present invention, of which FIG. 1 is a plan view showing the resin-sealed semiconductor device with a portion of the seal resin above a portion of leads broken away and FIG. 2 is a sectional view of the resin-sealed semiconductor device.

Referring to FIG. 1 and FIG. 2, reference numeral 1 denotes a semiconductor chip and 2, 2, ... denote pad electrodes provided on the surface of the semiconductor chip, of which 2c and 2s denote electrodes of power supply system, 2c denoting a power supplying (Vcc) electrode and 2s denoting a grounding (Vss) electrode. The pad electrodes 2, 2, ... are arranged virtually in a row close to the center line in parallel with the long side of the semiconductor chip 1.

Reference numerals 3, 3, ... denote outer leads of an SOJ package, of which 3c and 3s denote outer leads in pairs of power supply system, 3c denoting a Vcc outer lead and 3s denoting a Vss outer lead. Reference numeral 4, 4, ... denote inner leads extended from the outer leads 3 toward the interior of the package, of which 4c and 4s denote inner leads in pairs of power supply system, 4cc denoting a Vcc inner lead and 4s denoting a Vss inner lead.

The present embodiment constitutes an example of resin-sealed semiconductor device for 16M SHAM (Static Random Access Memory) in which one pair of the Vcc outer lead 3c and Vss outer lead 3s is provided for each of the long sides of an SOJ package having 36 outer leads 3 and, further, the Vcc outer leads 3c and the Vss outer leads 3s each are diagonally arranged in the package.

Reference numeral 5 denotes a common conductor which is engaged with the inner lead 4c or 4s of power supply system. The common conductors 5 are arranged in parallel and close to the center line in the direction in parallel with the long side of the semiconductor chip 1, of which 5c denotes a Vcc common conductor and 5s denotes a Vss common conductor. One common conductor 5 is provided for each of four inner leads 4c or 4s of power supply system and the inner lead 4 formed of one common conductor 5c or 5s and one inner lead 4c or 4s of power supply system is L-shaped. Ends of the other inner leads 4, 4, ... are spaced apart from the common conductor 5 toward the long side of the SOJ package.

The common conductor 5 is made of the same material as that of a lead frame, for example Fe-Ni alloy or Cu alloy. The other end of the common conductor 5 is engaged with a support bar 6 of the lead frame pulled in from the middle of the short side of the SOJ package. Thus, one end of the L-shaped inner lead 4 formed of the common conductor 5 and the inner lead 4c or 4s of power supply system is supported by the outer lead 3c or 3s of power supply system and the other end is supported by the support bar 6. Therefore, the L-shaped inner lead 4 is not deformed by an external force and naturally produces no twist.

Reference numeral 7 denotes a film insulator made for example of polyimide resin electrically insulating the inner leads 4 from the semiconductor chip 1 and also putting the semiconductor chip 1 and the inner lead 4 together with a thermoplastic adhesive (not shown).

There are provided four film insulators 7 corresponding to the four L-shaped inner leads 4. To the top surface of the film insulator 7, the end portion of one inner lead 4c or 4s of power supply system, the common conductor 5c or 5s, and end portions of the other inner leads 4, 4, ... are cemented.

The pad electrodes 2, 2, ... uncovered by the film insulators 7, 7, ... are electrically connected with the inner leads 4c and 4s of power supply system, the common conductors 5, and the other inner leads 4, 4, ... through bonding wires 8. Reference numeral 9 denotes seal resin.

By arranging as described above, it becomes possible to dispose the Vcc electrodes 2c, 2c, ... and the Vss electrodes 2s, 2s, ... in arbitrary positions on the semiconductor chip 1.

The reason why is that the Vcc electrodes 2c, 2c, ... can be connected with the nearby Vcc inner lead 4c and the common conductor 5c through bonding wires of a minimum length and, hence, it is only required to dispose the Vcc electrodes 2c, 2c, ... along the Vcc inner lead 4c and the common conductor 5c. Likewise, because the Vss electrodes 2s, 2s, ... are disposed along the Vss inner lead 4s and the common conductor 5s, the Vss electrodes 2s, 2s, . . . can be disposed in arbitrary positions on the semiconductor chip 1.

As described in the foregoing, the inner lead 4 formed of the inner lead 4c or 4s of power supply system and the common conductor 5 are arranged in the shape of the letter L. Such L-shaped inner leads 4 formed of two pairs of inner leads 4c and 4s of power supply system are arranged virtually to have a cross-shaped configuration, with other ends of the inner leads 4 engaged with the support bars 6. Hence, such deformation as a twist is not produced in the inner leads 4. As a result, no such trouble is caused as ununiform adhesive force between the film insulator 7 and the inner lead 4 or the common conductor, difference in level between the top surfaces of the end portion of the inner lead 4 and the common conductor 5, and an inclination of the semiconductor chip 1 after cementing. Accordingly, supersonic energy effectively propagates in the wire bonding and stabilized wire bonding is achieved, and a shorting between a bonding wire for signal 8 and the common conductor 5 due to a partial rising of the common conductor 5 coming into contact with the bonding wire crossing over the same can be eliminated. Further, an inclination of the semiconductor chip 1 can be prevented and, hence, failure in the resin forming such as a resin-unfilled portion or a void of resin can be prevented.

Below will be described a second to a fifth embodiment of the resin-sealed semiconductor device according to the present invention with reference to FIG. 3 to FIG. 6.

FIG. 3 to FIG. 6 are plan views of resin-sealed semiconductor devices of the present invention with a portion of the seal resin above a portion of leads broken away to show the main part of the invention.

Figure 3:
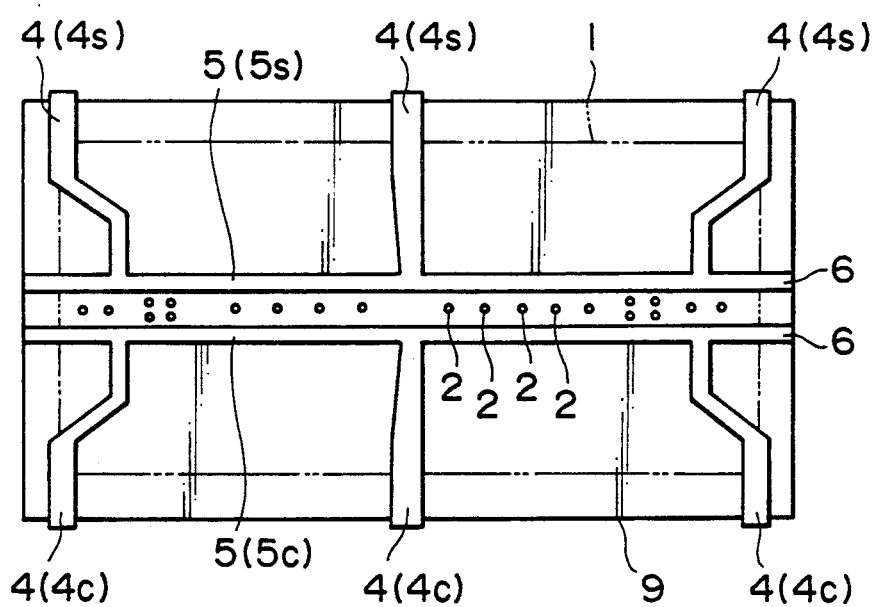
FIG. 3 is a plan view of a resin-sealed semiconductor device of a second embodiment of the present invention with a portion of the seal resin above a portion of leads broken away.

FIG. 3 shows a second embodiment of the present invention in which two support bars 6 of the lead frame pulled in from the middle of both of the short sides of an SOJ package are coupled together within the package so as to form two parallel common conductors 5 close to the center line in the longitudinal direction of the semiconductor chip 1. The outer leads 3c and 3s of power supply system are separately disposed at the opposing two long sides. Three each of the Vcc outer leads 3c and the Vss outer leads 3s are disposed at the center and both ends of each side. Accordingly, the inner leads 4 in the second embodiment formed of the inner leads 4c and 4s of power supply system and the common conductor 6c and 5s, respectively, have configurations of a combination of letters π and T.

Figure 4:
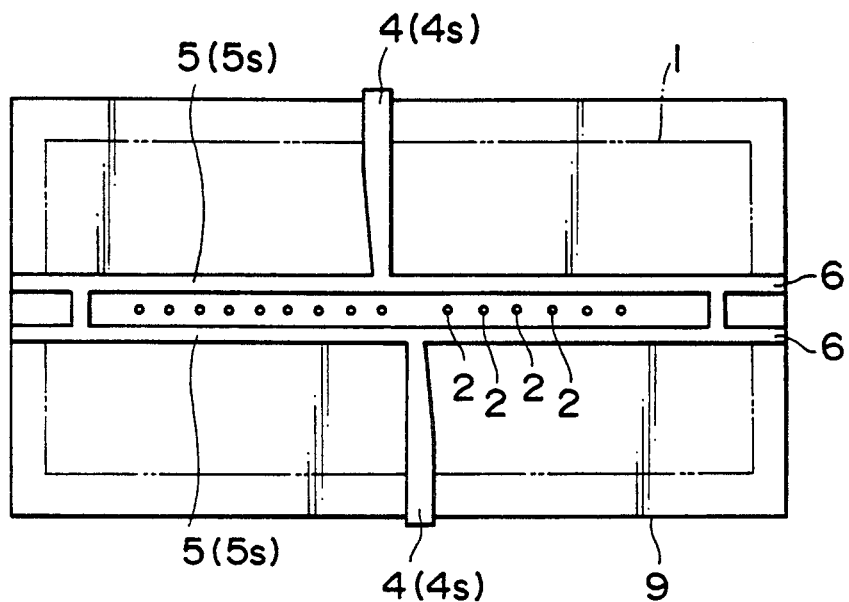
FIG. 4 is a plan view of a resin-sealed semiconductor device of a third embodiment of the present invention with a portion of the seal resin above a portion of leads broken away.

FIG. 4 shows a third embodiment of the present invention. This embodiment is different from the second embodiment in that the outer leads 3c and 3s of power supply system existing at both ends of the long sides of the SOJ package are not coupled with the two parallel common conductors 5 and that the two parallel common conductors 5 are coupled with each other at the circumference of the semiconductor chip 1. This arrangement is possible when the inner lead 4s of power supply system and the common conductor are applied with only ground potential.

Accordingly, the inner leads 4 in the third embodiment formed of grounded outer leads 3s and the grounded common conductors 5s have a configuration of a combination of two T-letter shapes.

Figure 5:
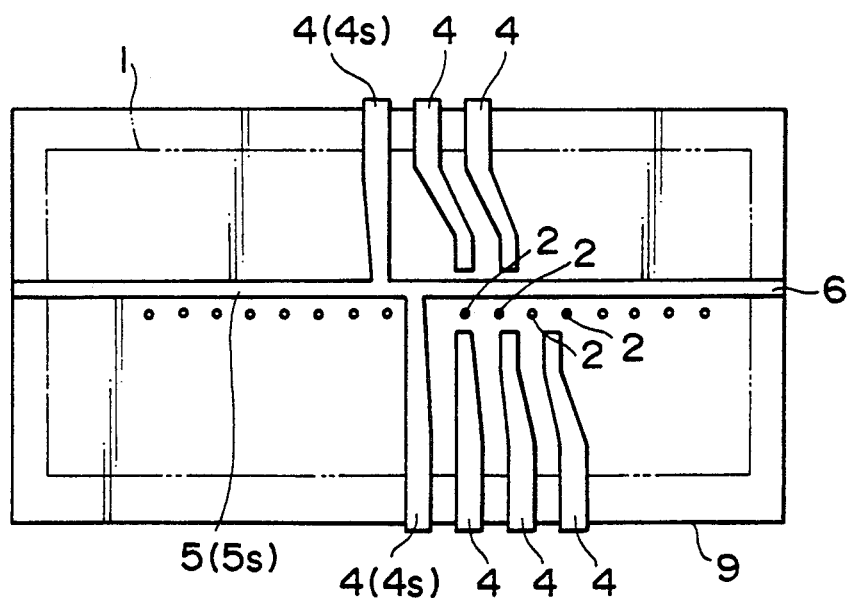
FIG. 5 is a plan view of a resin-sealed semiconductor device of a fourth embodiment of the present invention with a portion of the seal resin above a portion of leads broken away.

FIG. 5 shows a fourth embodiment of the present invention, in which a T-shaped inner lead 4 formed of a grounded inner lead 4s and a grounded common conductor 5s is coupled with a grounded inner lead 4s from the other side.

The inner lead 4 in the fourth embodiment formed of the grounded inner leads 4s and the grounded common conductor 5 has a crossed-shape configuration.

In this case, the inner leads 4, 4, . . . on the side having no common conductor 5s can be brought close to the pad electrodes 2, 2, . . . , and the pad electrodes 2, 2, . . . and the inner leads 4, 4, . . . can be connected with bonding wires 8, 8, . . . without crossing over a common conductor. Hence, no shorting is produced between the bonding wires 8, 8, . . . and the common conductor 5. Further, such a merit can be obtained that the bonding wires 8, 8, . . . do not deform when sealing resin is injected.

Figure 6:
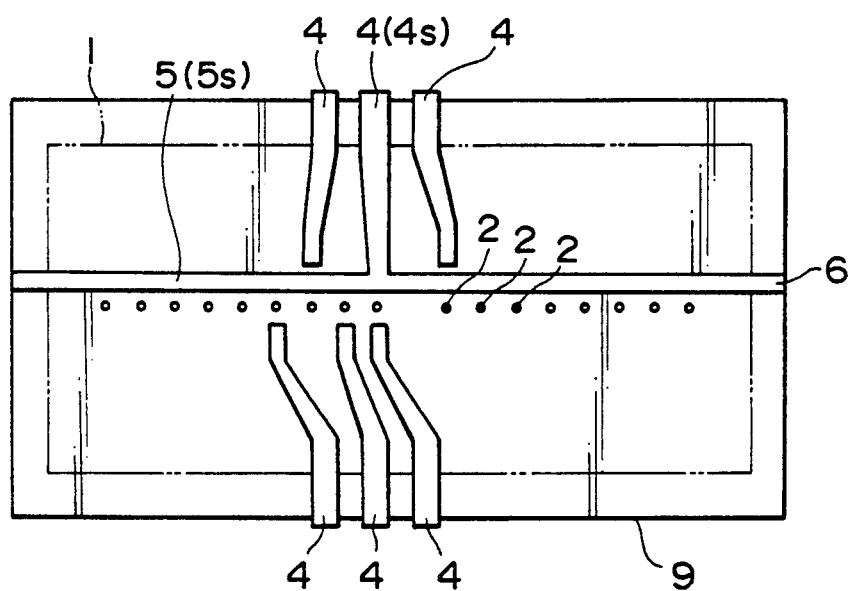
FIG. 6 is a plan view of a resin-sealed semiconductor device of a fifth embodiment of the present invention with a portion of the seal resin above a portion of leads broken away.

FIG. 6 shows a fifth embodiment of the present invention. This embodiment is different from the fourth embodiment in that the inner lead 4 is not coupled with a grounded inner lead 4s coming from the middle of the other side. The inner lead 4 formed of the grounded inner lead 4s and the grounded common conductor 5s have a T-shaped configuration. Of course, the merit obtained from the arrangement having the common conductor 5s disposed only on one side is the same as obtained in the fourth embodiment.

As described in the foregoing, there are considered various modes in the embodiments of the inner lead 4 formed of the inner lead 4c or 4s of power supply system and the common conductor 5c or 5s, i.e., the same can take various shapes, other than the L-shape described in the first embodiment, such as T-shape, π-shape, and cross-shape.

These embodiments of course operate in the same way, and provide the same merits, as the first embodiment.

In brief, the merits obtained from the present invention are that, even if a large number of outer leads of power supply are used in a resin-sealed semiconductor device and they are disposed in various positions, stabilized wire bonding, without lowering the productivity, and stabilized resin forming can be achieved.

What is claimed is:

1. A rectangular resin-sealed semiconductor having four sides, two opposite sides of which are short sides and the other sides are longer relative to said short sides, comprising:

a semiconductor chip having pad electrodes formed on a circuit forming surface in the interior of the main surface; and a plurality of inner leads cemented to said semiconductor chip through an insulator for electric insulation such that ends of said inner leads reach the edge of the circuit forming surface of said semiconductor chip; wherein common conductors, which are connected with at least one of power supplying inner leads, and/or grounding inner leads, and at least one of said inner leads are coupled on said semiconductor chip, and said common conductors engage at least one support bar extending to the middle of one of said short sides.

2. A resin-sealed semiconductor device according to claim 1, wherein the configuration of said common conductor and said inner lead coupled together is virtually L-shaped.

3. A resin-sealed semiconductor device according to claim 1, wherein the configuration of said common conductor and said inner lead coupled together is virtually T-shaped.

4. A resin-sealed semiconductor device according to claim 1, wherein the configuration of said common conductor and said inner lead coupled together is virtually $\pi$-shaped.

5. A resin-sealed semiconductor device according to claim 1, wherein the configuration of said common conductor and said inner lead coupled together is virtually cross-shaped.

* * * * *